United States Patent [19]

Lane

[11] Patent Number: 4,534,100
[45] Date of Patent: Aug. 13, 1985

[54] ELECTRICAL METHOD OF MAKING CONDUCTIVE PATHS IN SILICON

[75] Inventor: Clyde H. Lane, Rome, N.Y.

[73] Assignee: The United States of America as represented by the Secretary of the Air Force, Washington, D.C.

[21] Appl. No.: 393,169

[22] Filed: Jun. 28, 1982

[51] Int. Cl.³ .......................................... H01L 21/326
[52] U.S. Cl. ........................................ 29/586; 29/584;
29/585; 29/591; 148/1.5; 148/171; 148/183;
148/187; 204/130
[58] Field of Search .................................. 29/584–586,
29/591; 204/130; 148/171, 183, 187, 1.5

[56] References Cited

U.S. PATENT DOCUMENTS

| | | | |
|---|---|---|---|
| 2,854,362 | 9/1930 | Brand et al. | 29/586 X |
| 3,188,244 | 6/1965 | Hutchins et al. | 148/1.5 |
| 3,206,340 | 9/1965 | Stelmak | 29/586 X |
| 3,378,409 | 4/1968 | Hurle et al. | 148/171 X |
| 3,474,530 | 10/1969 | Ainslie et al. | 29/624 |
| 3,716,469 | 2/1973 | Bhatt et al. | 204/192 |
| 3,830,657 | 8/1974 | Farrar | 357/67 X |
| 4,171,990 | 10/1979 | Cline et al. | 148/1.5 |
| 4,377,423 | 3/1983 | Anthony | 148/171 |
| 4,381,598 | 5/1983 | Anthony | 25/585 |

*Primary Examiner*—George T. Ozaki
*Attorney, Agent, or Firm*—Donald J. Singer; Stanton E. Collier

[57] ABSTRACT

A method of forming an electrical conductive path between parallel surfaces of a substrate is disclosed wherein a pulsed voltage, non-current limited, power supply causes aluminum to electromigrate between at least two opposing points to form an alloy with silicon of the substrate. Electronic devices can be thus contacted through said conductive path and thus placed upon opposite sides of the substrate for purposes of packaging, shielding, etc.

1 Claim, 3 Drawing Figures

4,534,100

ELECTRICAL METHOD OF MAKING CONDUCTIVE PATHS IN SILICON

STATEMENT OF GOVERNMENT INTEREST

The invention described herein may be manufactured and used by or for the Government for governmental purposes without the payment of any royalty thereon.

BACKGROUND OF THE INVENTION

This invention relates generally to electrical devices, and, more particularly, to a method of connecting electrical devices.

Conventional electrical devices, such as semiconductor devices, are mounted on printed circuit boards and appropriate electrical connections are made with conductive strips between desired contacts. It is not even necessary to confine devices to the same side of the printed circuit board because conductive paths can be provided by drilling a hole therethrough and attaching the appropriate strips with a solid conductive material running through the hole. This technique is suitable when there is sufficient space for the devices and the electrical paths, and the interconnecting holes do not damage the underlying board. If damage to the board is of concern, an alternative method of interconnecting the devices would be desirable.

On a reduced scale as compared to mounting semiconductor devices on printed circuit boards, such as may occur on integrated circuits, devices such as diodes, transistors, resistors, etc. are only formed on one side of a mounting substrate. These devices are connected by electrical strips on the same side of the substrate, and the substrate is mounted in a package having pins that are used for connecting to other devices.

There currently exists, therefore, a need for a method for connecting electrical devices on the opposite side of a substrate that is nondestructive of the substrate and that can be used on integrated circuit substrates where space is a premium.

SUMMARY OF THE INVENTION

The present invention overcomes the problems encountered in the past and described hereinabove by providing a method of electrically connecting circuits on the opposite side of a substrate.

The method of the invention involves taking a silicon wafer substrate of the type conventionally used for integrated circuits, and oxidizing layers on selective areas on opposite sides to electrically isolate probe contacts of this invention from other devices. Openings through the oxide layers are etched using conventional photolithographic techniques. To make one conductive path therethrough, the openings are formed opposite each other. Into one opening an acceptor type dopant is diffused and into the other opening a donor type dopant is diffused using conventional IC fabrication techniques. Both openings are reetched to expose the silicon wafer substrate. After this, aluminum is selectively vapor deposited over the openings using conventional techniques. Current probes are placed on the aluminized openings and a high voltage is impressed across the substrate until a first breakdown occurs; thereafter, the voltage is again applied unitl a second breakdown current channel is formed and the aluminum has followed the channel to make a low resistance contact between the two aluminized openings.

It is therefore an object of this invention to provide an electrical conductive path through a silicon wafer substrate.

It is a further object of this invention to provide a method of forming the electrical conductive path through the silicon wafer substrate.

It is a still a further object of this invention to provide a method of forming electrical conductive paths which minimize the heat to which the substrate is subjected.

It is another object of this invention to provide a method of creating electrical conductive paths through a silicon wafer at specified locations.

These and many other objects and advantages of the present invention will be readily apparent to one skilled in the pertinent art from the following detailed description of the preferred embodiment and the claims when considered in conjunction with the drawings.

DETAILED DESCRIPTION OF THE PREFERRED EMBODIMENT

This invention makes a beneficial use of a phenomenon called electromigration. Electromigration normally is associated with the breakdown of electronic devices and its prevention is well documented in such patents as U.S. Pat. No. 3,474,530 entitled, "Mass Production of Electronic Devices", by Ainslie et al. This phenomenon is caused by the application of a voltage to a resistive element. Ion flow direction is a function of the element temperature and majority carrier type. Positive ions in a molten element flow toward the negative electrode.

Figure 1:
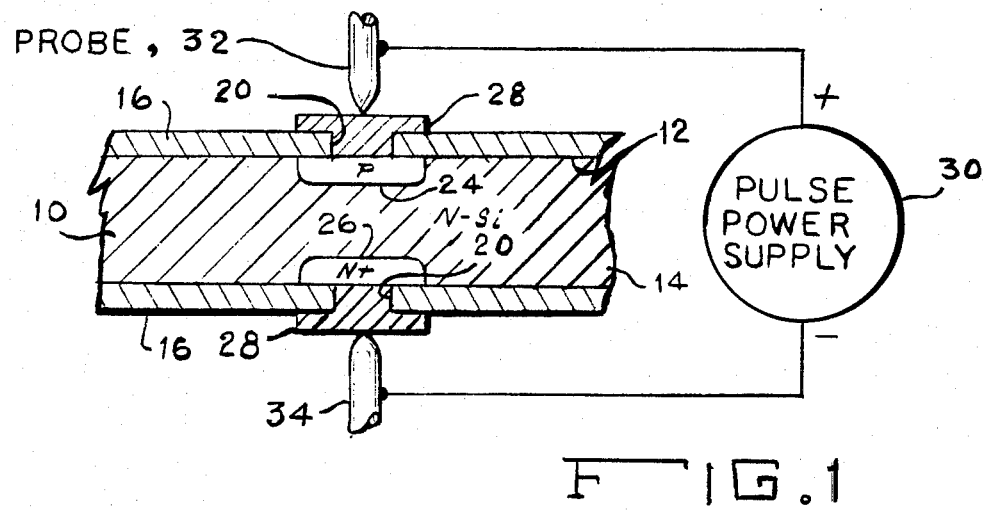
FIG. 1 is a cross-section of a silicon wafer substrate prepared to receive a voltage pulse to form an electrical conductive path therethrough.
Figure 2:
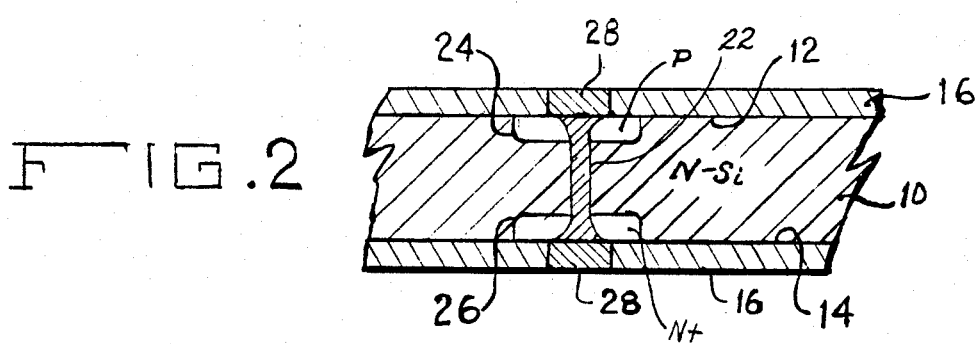
FIG. 2 is a cross-section of a silicon wafer substrate having a conductive path therethrough.
Figure 3:
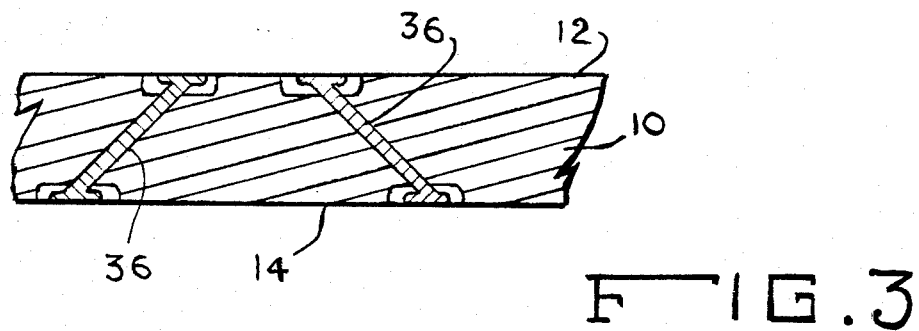
FIG. 3 is a cross-section of a silicon wafer substrate having slanting conductive paths therethrough.

Reference is now made to FIG. 1 of the drawing which best illustrates a setup for making an electrical conductive path 22, FIG. 2, across a silicon wafer substrate 10. The same reference numerals will be used in FIGS. 1, 2 and 3 to identify identical elements. The dimensions shown in the Figures are not intended to be those actually used, but those used for illustrative purposes. Preferred dimensions are noted hereinafter.

Silicon wafer substrate 10 has a preferred crystal orientation of (100) because the breakdown path followed minimizes the path length through the substrate. Other orientations are feasible but are not as desirable. Substrate 10 is not limited to silicon, but other semiconductor single crystalline materials may also be used. The preferred material for this invention is an n-type silicon wafer. Wafer substrate 10 is prepared in a conventional manner. A first surface 12 onto which electronic devices (not shown) are fabricated and a second surface 14 are polished in a conventional manner.

After silicon wafer substrate 10 is prepared as noted hereinabove, a masking layer 16, shown in FIGS. 1 and 2, composed of silicon oxide is deposited on first and second surface 12 and 14, respectively, by the conventional technique of chemical vapor deposition, such as heating silane in an atmosphere containing oxygen at a temperature at which the silane decomposes to form silicon oxide which then deposits on substrate 10. Masking layer 16 has a thickness of about 5000 angstroms. Next, a pluarality of contact openings 20, only two shown in each figure, are formed by depositing a photoresist layer on masking layer 16. Contact openings 20 are formed using conventional photolithographic techniques and then the masking layer 16 is etched away so that contact openings 20 have a bottom upon substrate 10. Contact openings 20 formed as above should have an area of about one mil square on a side. In order to form an electrical conductive path 22 as shown in FIG. 2, a pair of contact openings 20 should be directly opposite one another on substrate 10. This, of course, facilitates the forming of the breakdown path having the minimum distance between surfaces 12 and 14.

After contact openings 20 are formed by etching, dopants are selectively diffused into substrate 10 as hereinafter defined. Contact openings 20 having bottoms upon first surface 12 of substrate 10 are positioned in a conventional apparatus (not shown) for diffusion of dopants. A p-type dopant such as boron is then allowed to diffuse into substrate 10 through contact openings 20 to form p-type regions 24, only one shown in FIG. 1; p-type regions 24 only extend slightly beyond contact openings 20 into substrate 10. Substrate 10 is then repositioned in the diffusion apparatus so that an n-type dopant such as phosphorus can be diffused into contact openings 20 having second surface 14. This diffusion forms n-type regions 26, only one shown in FIGS. 1 and 2, having an n-type dopant level greater than substrate 10. Substrate 10 is then reetched so that all dopants are removed from the photoresist layers and from contact openings 20. Contact openings 20 form sites upon which electrical contacts 28 are formed. At this point, a metal such as aluminum is evaporated by conventional techniques so that all contact openings 20 are filled with aluminum to a thickness of about 0.025 to 0.035 inches. These aluminum contacts 28 serve as future circuit contacts and also as a source of aluminum which is to migrate into substrate 20. The shape of contacts 28 is controlled by photolithographic techniques. Aluminum contacts 28 extend onto masking layers 16 and can be connected to other contacts 28 by strips of conductive material. Isolated contacts 28 are shown in the Figures.

In order to create electrical conductive paths 22 as shown in FIG. 2, a pulse power supply 30 having a positive probe 32 and a negative probe 34 is positioned as shown in FIG. 1. A sufficient voltage is applied to create a first breakdown path and thereafter a second voltage is applied to create a second breakdown path. Pulse power supply 30 should not be current limited and should output a pulse width of about 100 microseconds durations to cause the aluminum to migrate into substrate 10 to create an aluminum-silicon alloy path 22 that runs from first surface 12 to second surface 14. After this formation, excess aluminum can be etched away fron contact openings 20 to result in electrical conductive path 22 as shown in FIG. 2. Alternatively, silicon dioxide layer 16 and the remaining contact aluminum can be etched away to leave substrate 10 with first and second surfaces 12 and 14 with conductive path 22 therebetween. Using conventional techniques, electronic devices can be formed in substrate 10 that utilize path 22 for operations.

Although the above preferred embodiment discloses a method of forming a conductive path 22 having a minimum length between the surfaces 12 and 14 of substrate 10, other conductive paths are equally possible. For example, a device formed on first surface 12 may required connections to a device which is not directly opposite on substrate 10. As a result, referring to FIG. 3, slanting conductive paths 36 are formed to make connection between devices (not shown) on opposite sides of substrate 10. The method of forming slanting conductive path 36 is similar to the above method except probe locations are changed to meet the required connection between the devices.

Clearly, many modifications and variations of the present invention are possible in light of the above teachings and it is therefore understood that, within the scope of the inventive concept, the invention may be practiced otherwise than specifically described.

What is claimed is:

1. A method of making electrical conductive paths between opposite surfaces of a semiconductor substrate having a dopant therethrough comprising the steps of:
   forming oxide layers on said opposite surfaces of said substrate;
   forming a plurality of contact openings in said oxide layers by photolithography;
   diffusing dopants into said substrate through said contact openings, a p-type dopant diffused into a first surface of said substrate, and an n-type dopant diffused into a second surface of said substrate, a concentration of a diffusing dopant exceeding said dopant of said substrate being of the same type;
   removing diffusing dopants from said oxide layers and said substrate surfaces;
   depositing selectively metal into said contact openings to form metal contacts;
   connecting electrically a plurality of said metal contacts with strips of conductive material;
   applying a current source across selected metal contacts;
   causing breakdown current channels between said selected metal contacts with said current source whereby said metal of said metal contacts flows in said channels; and
   removing said oxide layers, said strips, and said metal contacts.

* * * * *